(12) United States Patent
Huang et al.

(10) Patent No.: US 8,274,085 B2
(45) Date of Patent: Sep. 25, 2012

(54) PIXEL STRUCTURE AND FABRICATION METHOD THEREOF

(75) Inventors: Sung-Hui Huang, Hsinchu (TW); Henry Wang, Hsinchu (TW); Fang An Shu, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 204 days.

(21) Appl. No.: 12/789,834

(22) Filed: May 28, 2010

(65) Prior Publication Data
US 2011/0220906 A1      Sep. 15, 2011

(30) Foreign Application Priority Data
Mar. 10, 2010   (TW) ................................ 99106896 A

(51) Int. Cl.
| H01L 29/10 | (2006.01) |
| H01L 29/12 | (2006.01) |
| H01L 27/14 | (2006.01) |
| H01L 29/04 | (2006.01) |
| H01L 29/15 | (2006.01) |
| H01L 31/036 | (2006.01) |
| H01L 21/00 | (2006.01) |

(52) U.S. Cl. ................ 257/72; 257/43; 438/30

(58) Field of Classification Search .................. 438/165, 438/161
See application file for complete search history.

(56) References Cited

U.S. PATENT DOCUMENTS
| 2005/0167669 A1* | 8/2005 | Kim et al. ...................... 257/72 |
| 2011/0017989 A1* | 1/2011 | Chen et al. ...................... 257/43 |
| 2011/0159618 A1* | 6/2011 | Shinn et al. ...................... 438/30 |

* cited by examiner

*Primary Examiner* — Ha Tran T Nguyen
*Assistant Examiner* — Valerie N Brown
(74) *Attorney, Agent, or Firm* — Rosenberg, Klein & Lee

(57) ABSTRACT

The present invention discloses pixel structures and fabrication methods thereof. The pixel includes a thin film transistor forming at a thin film transistor region and a storage capacitor forming at a pixel electrode region. The method includes: forming a gate conduction layer on a substrate; forming a gate insulation layer on the gate conduction layer; forming a source conduction layer and a drain conduction layer on the gate insulation layer, in which the drain conduction layer has an extension section extending to the pixel electrode region; forming a channel layer on the source conduction layer and the drain conduction layer; and forming a protection layer on the channel layer. The extension section and an electrode layer serve as the upper and lower electrode of the storage capacitor, respectively. Wherein the gate conduction layer, the source conduction layer, the drain conduction layer, and the channel layer are made of metallic oxides.

14 Claims, 3 Drawing Sheets

PIXEL STRUCTURE AND FABRICATION METHOD THEREOF

BACKGROUND OF THE INVENTION

1. Field of the Invention

The present invention relates to a pixel structure, and, more particularly, to the pixel structure and a fabrication method manufacturing the same utilizing metallic oxides.

2. Description of Related Art

Please refer to FIGS. 1A and 1B, which are conventional pixel structures of thin film transistors.

The thin film transistor (TFT) can be categorized into the following two forms: a bottom-gate structure thin film transistor 1a and a top-gate structure thin film transistor 2a.

As shown in FIG. 1A, a pixel 1 is formed at a substrate 11, which can be separated into a thin film transistor region 10a and a pixel electrode region 10b. The bottom-gate structure thin film transistor 1a is formed at the thin film transistor region 10a. A gate conduction layer 12a, a gate insulation layer 13, a channel layer 14, source and drain conduction layers 16a and 16b, a protection layer 17, and a pixel electrode layer 18 are disposed sequentially in order to form the bottom-gate thin film transistor 1a. The pixel electrode layer 18 connects with the drain conduction layer 16b through the via hole 19. The source and drain conduction layers 16a and 16b contact to the channel layer 14 through the heavily doping semiconductor layer 15 for reducing the contact resistance between the source and drain conduction layers 16a and 16b and the channel layer 14.

The storage capacitor 1b is formed at the pixel electrode region 10b. The electrode layer 12b and the pixel electrode layer 18 serve as an upper electrode and a lower electrode of the storage capacitor 1b, respectively, and the gate insulation layer 13 and the protection layer 17 serve as an insulation layer of the storage capacitor 1b. The electrode layer 12b and the gate conduction layer 12a are formed at the same time but are separated from each other.

The gate conduction layers 12a and 12b, and the source and drain conduction layers 16a and 16b are usually made from opaque and conductive metal materials, such as gold, silver, titanium, aluminum, and compound metal thereof. The channel layer 14 is usually made from amorphous silicon semiconductor. The pixel electrode layer 18 is usually made from translucent and conductive metallic oxides, such as ITO, IZO, IGZO, etc.

Another pixel 2 of FIG. 1B has the top-gate structure thin film transistor 2a at the thin film transistor region 10a, and has a storage capacitor 2b at the pixel electrode region 10b. The top-gate structure thin film transistor 2a is formed by sequentially disposing the separated source and drain conduction layers 16a and 16b, the channel layer 14, the gate insulation layer 13, the gate conduction layer 12a, the protection layer 17, and the pixel electrode layer 18. Alternatively, another top-gate structure thin film transistor (not shown) may include the channel layer 14 formed upon the substrate 11 while the separated source and drain conduction layers 16a and 16b formed upon the channel layer 14.

The storage capacitor 2b is formed at the pixel electrode region 10b. The electrode layer 16c and the pixel electrode layer 18 serve as the upper electrode and the lower electrode of the storage capacitor, and the gate insulation layer 13 and the protection layer 17 serve as the insulation layer of the storage capacitor 2b. The electrode layer 16c and source and drain conduction layers 16a and 16b, all of which are separated from each other, are formed at the same time.

As described above, the bottom-gate structure thin film transistor 1a and the top-gate thin film transistor 2a are only different in the sequence of disposing each of the aforementioned layers.

The conventional gate conduction layer 12a and source and drain conduction layers 16a and 16b of the thin film transistors 1a and 1b are made from opaque and conductive metal materials. Since the electrode layers 12b and 16c of the storage capacitors 1a and 1b may block the light from passing through, at the time of manufacturing light-penetrating display devices with the thin film transistors an aperture ratio (AR) may stay at 60%. Thus, such light-penetrating display devices at most provide only 60% of the light supplied by a backlight module. With a color filter, a polarizer, and other components of the display device absorbing the light, these display devices usually end up with being capable of providing only 10% of the light from the backlight module.

For increasing a luminance of the light-penetrating display device, many pixel designs have been prepared for increasing the AR of the pixel structure. But the luminance of the existing light-penetrating display devices still remains unsatisfactory without having the backlight module with greater luminance incorporated or increasing the cost of manufacturing the same.

SUMMARY OF THE INVENTION

The present invention provides a thin film transistor structure and a fabrication method for making the same. The method uses metallic oxides IGZO with different oxygen concentrations. The thin film transistor therein may have good transmittance. Thus, the thin film transistor may be used to make a pixel which has nearly 100% of aperture ratio.

The present invention provides a storage capacitor which is formed by extending an extension section of a drain conduction layer of the thin film transistor to a pixel electrode region as an electrode layer. The capacitance of the storage capacitor can be adjusted by changing the area of the upper electrode or the lower electrode covering the pixel electrode layer.

The present invention provides a pixel with bottom-gate structure thin film transistor. The extension section of the drain conduction layer of the thin film transistor extends to the pixel electrode region for replacing the pixel electrode layer. Thus, the time associated with the fabrication could be lowered, and the cost for the fabrication could be cut down.

The present invention provides a pixel structure including a substrate, a thin film transistor, and a storage capacitor. The substrate includes a thin film transistor region and a pixel electrode region. The thin film transistor is formed at the thin film transistor region and includes a drain conduction layer, which has an extension section extending to the pixel electrode region. Additionally, the thin film transistor may further include a pixel electrode layer electrically connected with the drain conduction layer through a via hole.

Furthermore, the thin film transistor may have a channel layer, a gate conduction layer, a source conduction layer, and the drain conduction layer, all of which are made from metallic oxides including indium, gallium, and zinc. The storage capacitor is formed at the pixel electrode region, and an electrode layer and the extension section of the drain conduction layer may serve as the upper electrode and the lower electrode of the storage capacitor, respectively.

The present invention further provides a fabrication method for manufacturing the pixel. The method includes providing the substrate having the thin film transistor region and the pixel electrode region, forming the thin film transistor at the thin film transistor region of the substrate, and forming the storage capacitor at the pixel electrode region. The drain conduction layer of the thin film transistor has the extension section, which extends to the pixel electrode region. Additionally, the electrode layer and the extension layer are configured to serve as the upper electrode and the lower electrode of the storage capacitor, respectively. And the pixel electrode layer of the thin film transistor is connected with the drain conduction layer through the via hole.

For further understanding of the invention, reference is made to the following detailed description illustrating the embodiments and examples of the invention. The description is only for illustrating the invention, not for limiting the scope of the claim.

BRIEF DESCRIPTION OF THE DRAWINGS

The drawings included herein provide further understanding of the invention. A brief introduction of the drawings is as follows.

DETAILED DESCRIPTION OF THE PREFERRED EMBODIMENTS

Figure 2A:
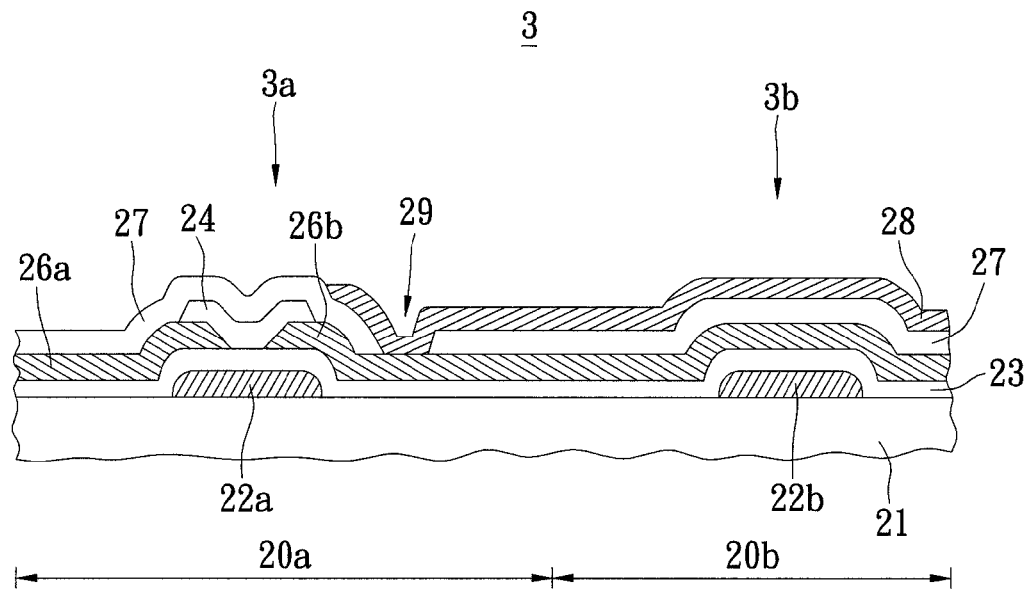
FIGS. 2A and 2B are structural diagrams of pixels with bottom-gate structure thin film transistors according to first and second embodiments of the present invention.

FIG. 2A illustrates a first embodiment according to the present invention. A pixel 3 is formed at a substrate 21 including a thin film transistor region 20a and a pixel electrode region 20b. A bottom-gate structure thin film transistor 3a is located at the thin film transistor region 20a. The thin film transistor 3a has a gate conduction layer 22a formed upon the substrate 21. A gate insulation layer 23 is formed upon the gate conduction layer 21. A source conduction layer 26a and a drain conduction layer 26b are separately formed upon the gate insulation layer 23. A channel layer 24 is formed between the source conduction layer 26a and drain conduction layer 26b. Meanwhile, a protection layer 27 is formed upon the source conduction layer 26a, the drain conduction layer 26b, and the channel layer 24. And a pixel electrode layer 28 is formed upon the protection layer 27 and connect with the drain conduction layer 26b through a via hole 29.

Alternatively, the channel layer 24 may be formed upon the gate insulation layer 23, and the source conduction layer 26a and drain conduction layer 26b may be formed upon the channel layer 24 so as to form another thin film transistor structure (not shown).

A storage capacitor 3b is formed at the pixel electrode layer 20b. The electrode layer 22b and the extension section of the drain conduction layer 26b serve as the upper electrode and the lower electrode of the storage capacitor 3b, respectively. And the gate insulation layer 23 and protection layer 27 serve as the insulation layer of the storage capacitor 3b. The electrode layer 22b and the gate conduction layer 22a are conductive layer, which are formed simultaneously but are separated from each other.

The substrate 21 may be a glass substrate or a plastic substrate. The gate insulation layer 23 may be one of the silicon nitrides (SiNx), silicon oxides (SiOx), aluminum oxides (AlOx), and yttrium oxides ($Y_2O_3$). The protection layer 27 may be one of the silicon oxides, silicon nitrides, aluminum oxides, yttrium oxides, resin, polyimide, inorganic, and organic. And the pixel electrode layer 28 is usually formed from translucent and conductive metallic oxide materials, such as ITO, IZO, or IGZO.

According to the present invention, the gate conduction layer 22a, the source conduction layer 26a, the drain conduction layer 26b, and the channel layer 24 may be made from metallic oxide materials including the oxides having indium, gallium, zinc, and oxygen (i.e., InGaZnOx or IGZO). The metallic oxides IGZO may be of good transmittance with the electric conductivity adjustable according to the oxygen concentration of the metallic oxides. Additionally, the metallic oxides IGZO would not cause the photoelectric effect when exposed under lights. Therefore, a completely translucent thin film transistor 3a may be formed by using the metallic oxides, and the aperture ratio of the pixel 3 may be close to 100%.

Ratios of the metallic oxides (IGZO) of the gate conduction layer 22a, the source conduction layer 26a, and the drain conduction layer 26b between the indium, the gallium, the zinc, and the oxygen may be 1:1:1:N, in which N is less than 4 because of the high electric conductivity requirements. When those layers are fabricated, the fabrication steps may be performed in a low oxygen concentration environment in which a ratio between $O_2$ and ($Ar+O_2$) is less than 2%. In other words, little or virtually no oxygen would be added into the environment when the fabricating steps for generating the metallic oxides IGZO with the characteristic of superior conductivity that would be suitable for the gate, the drain, and the source of the thin film transistor 3a.

Because the channel layer 24 needs to be of characteristic of a semiconductor, the oxygen concentration of the metallic oxides IGZO for manufacturing the channel layer 24 may increase to cause the ratios between the indium, the gallium, the zinc, and the oxygen to stay at 1:1:1:M of the IGZO where M is greater than 4. To achieve that particular goal, the fabrication process for the channel layer 24 may be performed in a high oxygen concentration environment in which the ratio between $O_2$ and ($O_2+Ar$) ranges between 2% to 15%. In other word, an appropriate amount of the oxygen would be added during the fabrication of the metallic oxides IGZO with the semiconductor characteristic. The thickness of the channel layer 24 is about 50 nm~100 nm, the energy gap of the metallic oxides is about 3 eV~3.5 eV, and the transmittance of the metallic oxides is about 85%~95%.

The drain and source of the conventional thin film transistor are made from metal materials, and the channel layer of the conventional thin film transistor is made from semiconductor materials. As the crystal lattice sizes of the metal material and the semiconductor material are different, a heavily doping semiconductor layer 15 (see FIGS. 1A and 1B) is formed between the source, the drain, and the channel layers for matching the lattice sizes of the semiconductor material and the metal material, in order to reduce the resistance of the Ohm contact between the drain, the source, and the channel layers. As described above, the source conduction layer 26a, the drain conduction layer 26b, and the channel layer 24 of the present invention are made from the metallic oxides IGZO, resulting in no difference in the lattice size of the metallic oxides between the source conduction layer 26a, the drain conduction layer 26b, and the channel layer 24. Thus, the source conduction layer 26a, the drain conduction layer 26b, and the channel layer 24 may contact directly with each other, eliminating the necessity of the forming of the heavily doping semiconductor layer 15, despite having a superior Ohm contact between them. Therefore, the fabrication time and cost for forming the semiconductor layer 15 may be no longer necessary according to the present invention.

Figure 1A:
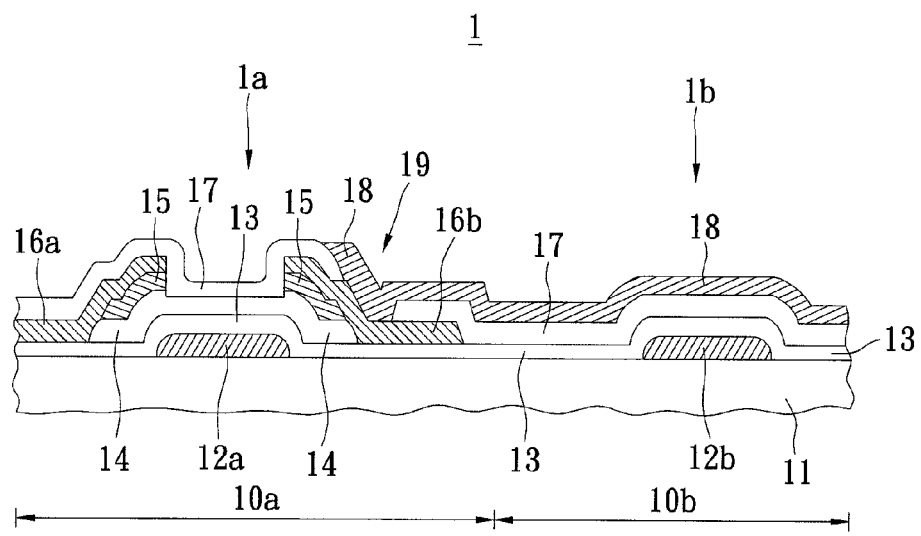
FIGS. 1A and 1B are structural diagrams of conventional thin film transistors.
Figure 1B:
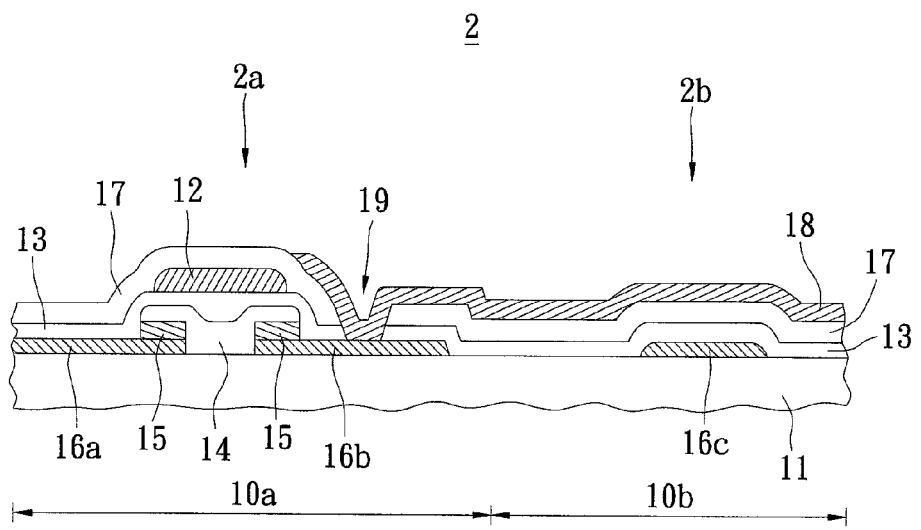

Conventionally, the thin film transistor of the light-penetrating display device is the bottom-gate structure thin film transistor 1a as shown in FIG. 1A. The channel layer 14 of the thin film transistor 1a is generally made from amorphous silicon semiconductors. Consequently, the amorphous silicon semiconductor may cause the photoelectric effect when exposed under lights, affecting the electrical characteristics of the thin film transistor 1a. Therefore, at the light-receiving side of the thin film transistor 1a, a gate conduction layer 12a needs to be formed to minimize the effect of the incoming lights. However, since the channel layer 24 is made from metallic oxides IGZO, which may not cause any photoelectric effect when exposed under lights, the thin film transistor 3a may normally operate even if the gate conduction layer 22a is made of the translucent materials.

Additionally, since the drain conduction layer 26b of the thin film transistor 3a is made of the metallic oxides IGZO the drain conduction layer may be translucent. Thus, an extension section of the drain conduction layer 26b may extend to the pixel electrode region 10b. And by regulating the areas of the electrode layer 22b and the extension section of the drain conduction layer 26b, the capacitance of the storage capacitor 3b may be readily adjusted. And the pixel 3 may also maintain the superior transmittance with the AR of the pixel 3 approaching to 100%. It is worth noting that the area size of the extension section or the electrode layer 22b may be the same as or close to the area of the whole pixel electrode region 20b.

According to the first embodiment of the present invention described above, the conventional fabrication steps may still be utilized for the fabrication of the thin film transistor 3a. In other words, the fabrication steps may not be subject to any change as the result of the utilization of the metallic oxides IGZO.

Figure 2B:
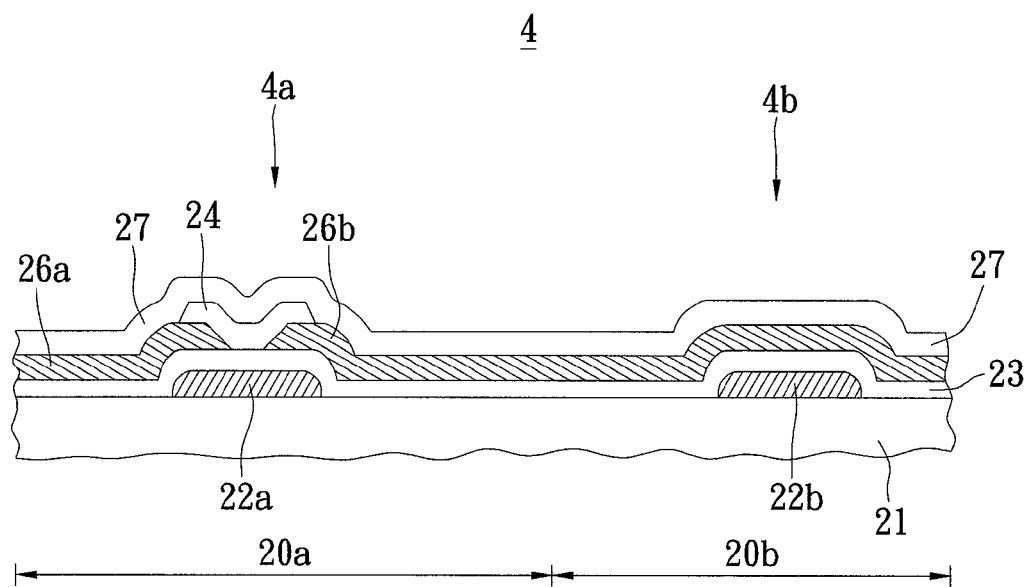

As shown in FIG. 2B, which is a second embodiment of the present invention, the pixel 4 has the bottom-gate structure thin film transistor 4a and the storage capacitor 4b. In FIG. 2B, since the extension section of the drain conduction layer 26b that extends to the pixel electrode region 20b may offer the same function as that of the pixel electrode 28 in FIG. 2A the pixel electrode 28 may be no longer necessary in the embodiment shown in FIG. 2B. At the same time, the via hole 29 becomes no longer necessary as well in the same embodiment. Consequently, the fabrication process for the pixel electrode 28 along with that for the via hole 29 including the manufacturing of the masks for them could be removed from the entire manufacturing procedure. Accordingly, the time for the manufacturing could be lowered, the yield rate could be improved, and the cost of the manufacturing could be further cut down.

Figure 3A:
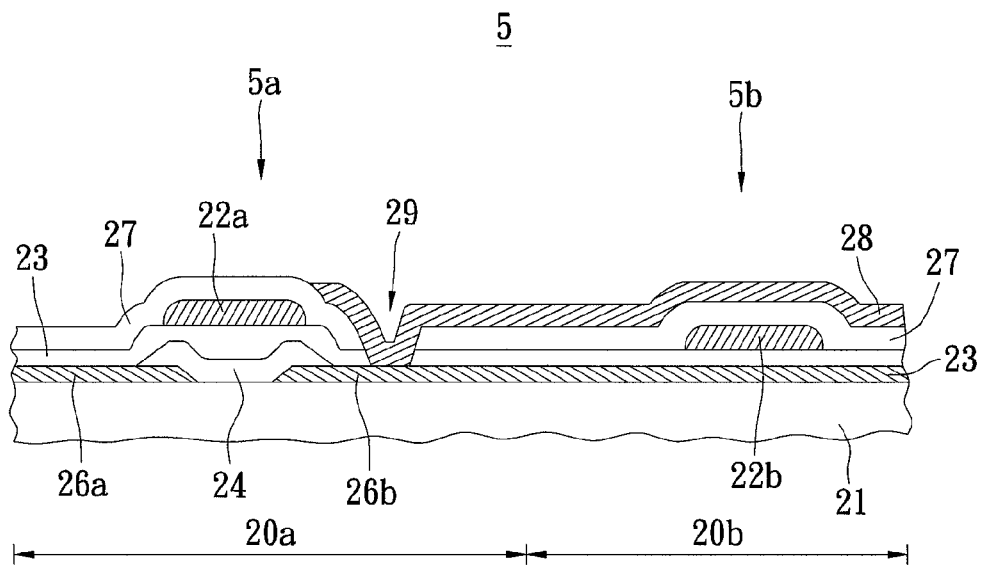
FIGS. 3A and 3B are structural diagrams of pixels with top-gate structure thin film transistors according to third and fourth embodiments of the present invention.

Please refer to FIG. 3A, which is the third embodiment of the present invention. The pixel 5 has a top-gate structure thin film transistor 5a and a storage capacitor 5b. In FIG. 3A, the sequence of forming the source and drain conduction layers 26a and 26b, the channel layer 24, the gate conduction layer 22a, and the electrode layer 22b is different to that of forming the aforementioned layers in FIG. 2A.

In the third embodiment, the source conduction layer 26a, the drain conduction layer 26b, and the gate conduction layer 22a are also made from the metallic oxides IGZO. Thus, the pixel 5 may also have the AR approaching the 100% mark.

The extension section of the drain conduction layer 26b may extend to the pixel electrode region 20b for serving as one electrode of the storage capacitor 5b. At the same time, the pixel electrode layer 28 is connected with the drain conduction layer 26b through the via hole 29, also for serving as the electrode of the storage capacitor 5b. Thus, the extension section of the drain conduction layer 26b, the pixel electrode layer 28, and the electrode 22b form the inter-digital storage capacitor 5b. The capacitance of the storage capacitor 5b may be adjusted by changing the areas of the extension section of the drain conduction layer 26b and the electrode layer 22b. In one embodiment, the areas of the extension section of drain conduction layer 26b and the electrode layer 22b are the same as the area of the whole pixel electrode region 20b.

Figure 3B:
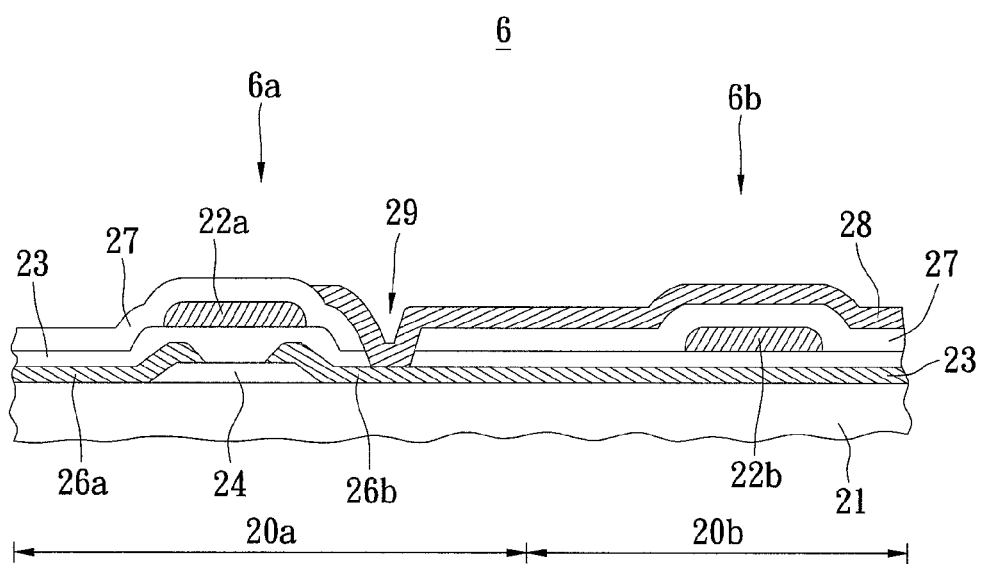

As shown in FIG. 3B, which is a fourth embodiment of the present invention, the pixel 6 has the top-gate structure thin film transistor 6a and the storage capacitor 6b. The differences between the FIGS. 3B and 3A are that, in FIG. 3B, the channel layer 24 is formed upon the substrate 21, and the source conduction layer 26a and the drain conduction layer 26b are formed on the channel layer 24 and substrate 21. Thus, the thin film transistor 6a is different from the thin film transistor 5a in the sequence of forming the layers, while the transmittance of the thin film transistor 6a and the storage capacitor 6b may still be close to 100%.

According to the present invention, by using metallic oxides IGZO with different oxygen concentrations to form the conduction layers and channel layers, the thin film transistors with good transmittances may be prepared. Additionally, the area of the pixel electrode 20b that is covered by the upper electrode or the lower electrode may be adjusted by extending the extension section of the drain conduction layer to the pixel electrode region, wherein the extension section serves as the electrode layer of the storage capacitor. And the capacitance of the storage capacitor may be adjusted as the result without affecting the characteristic of the translucent pixel electrode region. Thus, the pixel structures with nearly 100% AR may be prepared.

Some modifications of these examples, as well as other possibilities will, on reading or having read this description, or having comprehended these examples, will occur to those skilled in the art. Such modifications and variations are comprehended within this invention as described here and claimed below. The description above illustrates only a relative few specific embodiments and examples of the invention. The invention, indeed, does include various modifications and variations made to the structures and operations described herein, which still fall within the scope of the invention as defined in the following claims.

What is claimed is:

1. A pixel structure, comprising:
a substrate having a thin film transistor region and a pixel electrode region;
a thin film transistor formed at the thin film transistor region and including a drain conduction layer which has an extension section extending to the pixel electrode region, wherein the thin film transistor further includes a channel layer, a gate conduction layer, a source conduction layer, and the drain conduction layer; wherein the channel layer, the gate conduction layer, the drain conduction layer, and the source conduction layer are metallic oxides having indium, gallium, and zinc; and
a storage capacitor formed at the pixel electrode region, wherein an electrode layer and the extension section of the drain conduction layer serve as an upper electrode and a lower electrode of the storage capacitor, respectively, and the extension section of the drain conduction layer entirely covers the pixel electrode region, and the capacitance of the storage capacitance is proportional to sizes of the electrode layer and the extension section of the drain conduction layer.

2. The structure as in claim 1, wherein ratios between the indium, the gallium, the zinc, and an oxygen of the metallic oxides of the gate conduction layer, the source conduction layer, the drain conduction layer, and the electrode layer are 1:1:1:N wherein N is less than 4 while another ratio between the indium, the gallium, the zinc, and the oxygen of the metallic oxides of the channel layer is 1:1:1:M, in which M is greater than 4.

3. The structure as in claim 1, wherein the gate conduction layer, the drain conduction layer, and the source conduction layer are formed in an oxygen concentration environment with a ratio between $O_2$ and $(Ar+O_2)$ being less than 2%; and the channel layer is formed in another oxygen concentration environment with the ratio between $O_2$ and $(Ar+O_2)$ ranging from 2% to 15%.

4. The structure as in claim 1, wherein a thickness of the channel layer is between 50 nm and 100 nm, an energy gap of the metallic oxides of the channel layer is between 3 eV and 3.5 eV, and a transmittance of the channel layer is between 85% and 95%.

5. The structure as in claim 1, wherein the source conduction layer and the drain conduction layer are both located between the channel layer and the gate conduction layer.

6. A fabrication method of a pixel structure, comprising:
providing a substrate which has a thin film transistor region and a pixel electrode region; and
forming a thin film transistor at the thin film transistor region, and forming a storage capacitor at the pixel electrode region;
wherein a drain conduction layer of the thin film transistor has an extension section extending to the pixel electrode region, and an electrode layer and the extension section of the drain conduction layer serve as an upper electrode and a lower electrode of the storage capacitor, respectively; the extension section entirely covers the pixel electrode region, and the capacitance of the storage capacitance is proportional to sizes of the electrode layer and the extension section of the drain conduction layer;
wherein the thin film transistor has a channel layer, a gate conduction layer, a source conduction layer, and the drain conduction layer, all of which are metallic oxides having indium, gallium, and zinc.

7. The method as in claim 6, wherein ratios between the indium, the gallium, the zinc, and an oxygen of the metallic oxides of the gate conduction layer, the source conduction layer, the drain conduction layer, and the electrode layer are 1:1:1:N, in which N is less than 4, while another ratio between the indium, the gallium, the zinc, and the oxygen of the metallic oxides of the channel layer is 1:1:1:M where M is greater than 4.

8. The method as in claim 6, further comprising forming the gate conduction layer, the drain conduction layer, and the source conduction layer in an oxygen concentration environment with a ratio between $O_2$ and $(Ar+O_2)$ being less than 2%, and forming the channel layer in another oxygen concentration environment with the ratio between $O_2$ and $(Ar+O_2)$ ranging from 2% to 15%.

9. The method as in claim 7, wherein a thickness of the channel layer is between 50 nm and 100 nm, an energy gap of the metallic oxides of the channel layer is between 3 eV and 3.5 eV, and the transmittance of the channel layer is between 85% and 95%.

10. A pixel structure, comprising:
a substrate having a thin film transistor region and a pixel electrode region;
a thin film transistor formed at the thin film transistor region, the thin film transistor including a drain conduction layer which has an extension section extending to the pixel electrode region and a pixel electrode layer which electrically connects with the drain conduction layer through a via hole, wherein the thin film transistor further includes a channel layer, a gate conduction layer, a source conduction layer, and the drain conduction layer, all of which are metallic oxides having indium, gallium, and zinc; and
a storage capacitor formed at the pixel electrode region, wherein an electrode layer and the extension section of the drain conduction layer serve as an upper electrode and a lower electrode of the storage capacitor, respectively, and the extension section of the drain conduction layer entirely covers the pixel electrode region, and the capacitance of the storage capacitance is proportional to sizes of the electrode layer and the extension section of the drain conduction layer.

11. The structure as in claim 10, wherein the channel layer is electrically connected with the source conduction layer and the drain conduction layer; a protection layer is disposed above the channel layer, the gate conduction layer is disposed above the channel layer, and a gate insulation layer is disposed above the gate conduction layer.

12. The structure as in claim 10, wherein ratios between the indium, the gallium, the zinc, and an oxygen of the metallic oxides of the gate conduction layer, the source conduction layer, the drain conduction layer, and the electrode layer are 1:1:1:N, in which N is less than 4 while another ratio between the indium, the gallium, the zinc, and the oxygen of the metallic oxides of the channel layer is 1:1:1:M, in which M is greater than 4.

13. The method as in claim 6, wherein the source conduction layer and the drain conduction layer are both located between the channel layer and the gate conduction layer.

14. The structure as in claim 10, wherein the source conduction layer and the drain conduction layer are both located between the channel layer and the gate conduction layer.

* * * * *